(12) United States Patent
Han et al.

(10) Patent No.: US 12,622,058 B2
(45) Date of Patent: May 5, 2026

(54) DISPLAY SUBSTRATE AND DISPLAY DEVICE

(71) Applicant: BOE TECHNOLOGY GROUP CO., LTD., Beijing (CN)

(72) Inventors: Jiahui Han, Beijing (CN); Pengxia Liang, Beijing (CN); Zheng Fang, Beijing (CN); Ge Shi, Beijing (CN); Yanliu Sun, Beijing (CN); Yujie Liu, Beijing (CN); Qian Wu, Beijing (CN); Song Yang, Beijing (CN); Hongpeng Li, Beijing (CN); Hyunsic Choi, Beijing (KR); Weili Zhao, Beijing (CN); Kuanjun Peng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 768 days.

(21) Appl. No.: 17/759,996

(22) PCT Filed: Aug. 30, 2021

(86) PCT No.: PCT/CN2021/115477
§ 371 (c)(1),
(2) Date: Aug. 2, 2022

(87) PCT Pub. No.: WO2023/028792
PCT Pub. Date: Mar. 9, 2023

(65) Prior Publication Data
US 2024/0186329 A1     Jun. 6, 2024

(51) Int. Cl.
*H10D 86/60*     (2025.01)
*G02F 1/1343*     (2006.01)
(Continued)

(52) U.S. Cl.
CPC ........... *H10D 86/60* (2025.01); *H10D 86/441* (2025.01); *G02F 1/134336* (2013.01); *G02F 1/136286* (2013.01)

(58) Field of Classification Search
CPC .. H10D 86/60; H10D 86/441; G02F 2201/52; G02F 1/136286; G02F 1/134336; G09G 2300/0443; G09G 2300/0465; H10H 29/32
See application file for complete search history.

(56) References Cited

U.S. PATENT DOCUMENTS 6,847,343 B2 * 1/2005 Anzai ................... H10K 59/131
                                                        257/E27.111
2011/0205623 A1   8/2011 Uehara et al.
(Continued)

FOREIGN PATENT DOCUMENTS

CN     102445793 A     5/2012
CN     102854683 A   * 1/2013
(Continued)

OTHER PUBLICATIONS

State Intellectual Property Office of the People's Republic of China, Office Action Issued in Application No. 202180002342.5, Oct. 22, 2024, 18 pages.
(Continued)

*Primary Examiner* — William B Partridge
*Assistant Examiner* — Alexander X Ramirez
(74) *Attorney, Agent, or Firm* — McCoy Russell LLP

(57)     ABSTRACT

The present disclosure provides a display substrate and a display device. The display substrate includes a base substrate, a plurality of data lines arranged on the base substrate and extending in a first direction, a plurality of gate lines arranged on the base substrate and extending in a second direction, and a plurality of sub-pixels. Each sub-pixel at
(Continued)

least includes a first aperture region and a second aperture region spaced apart from each other in the first direction, the second aperture region is offset in the second direction with respect to the first aperture region, and an offset distance is less than or equal to a width of the first aperture region in the second direction.

18 Claims, 3 Drawing Sheets

(51) Int. Cl.
    *G02F 1/1362*     (2006.01)
    *H10D 86/40*     (2025.01)

(56) References Cited

U.S. PATENT DOCUMENTS

| | | | |
|---|---|---|---|
| 2015/0189258 A1 | 7/2015 | Jin et al. | |
| 2015/0355472 A1* | 12/2015 | Niioka | G02B 30/30 349/15 |
| 2016/0147122 A1* | 5/2016 | Hwang | G02F 1/133512 257/72 |
| 2016/0182898 A1 | 6/2016 | Asai et al. | |
| 2016/0202575 A1* | 7/2016 | Youk | G02F 1/134336 349/110 |
| 2018/0061866 A1* | 3/2018 | Koyama | G09G 3/3266 |
| 2019/0204700 A1 | 7/2019 | Liao et al. | |
| 2020/0333674 A1* | 10/2020 | Zhao | G02F 1/13394 |
| 2022/0216242 A1* | 7/2022 | Koyama | H10D 86/60 |

FOREIGN PATENT DOCUMENTS

| | | | | |
|---|---|---|---|---|
| CN | 104656331 A | 5/2015 | | |
| CN | 105425485 A | 3/2016 | | |
| CN | 107918221 A | 4/2018 | | |
| CN | 108803180 A | 11/2018 | | |
| CN | 209182621 U | 7/2019 | | |
| CN | 110879500 A | 3/2020 | | |
| CN | 109188805 B | * 8/2021 | | G02F 1/1333 |
| WO | 9522782 A1 | 8/1995 | | |
| WO | WO-2012169466 A1 | * 12/2012 | | G09G 3/003 |

OTHER PUBLICATIONS

European Patent Office, Extended European Search Report Issued in Application No. 21955371.6, Oct. 22, 2024, Germany, 10 pages.
Japanese Patent Office, Office Action Issued in Application No. 2023-560085, Apr. 1, 2025, 12 pages.

* cited by examiner

DISPLAY SUBSTRATE AND DISPLAY DEVICE

CROSS REFERENCE TO RELATED APPLICATIONS

The present application is a U.S. National Phase of International Application No. PCT/CN2021/115477 entitled "DISPLAY SUBSTRATE AND DISPLAY DEVICE," and filed on Aug. 30, 2021. The entire contents of the above-listed application are hereby incorporated by reference for all purposes.

TECHNICAL FIELD

The present disclosure relates to the field of display technology, in particular to a display substrate and a display device.

BACKGROUND

Three-dimensional (3D) application based on ultra-high resolution is the development trend of an existing 3D display technology, but an existing 3D scheme has such technical problems as moire pattern. One of reasons for the moire pattern lies in light-emission discontinuity of pixels. In a conventional pixel design, a source/drain metal line (SD line), e.g., a data line, is linear and non-transparent. When an image is displayed, periodic light shielding regions will appear between the pixels due to a low transmittance of the source/drain metal line, so the pixels emit light discontinuously. In a 3D display state, the moire pattern occurs due to the light-emission discontinuity of pixels.

SUMMARY

An object of the present disclosure is to provide a display substrate and a display device, so as to improve the light-emission continuity of the pixels, thereby to prevent the occurrence of the moire pattern.

The present disclosure provides the following technical solutions.

In one aspect, the present disclosure provides in some embodiments a display substrate, including a base substrate, a plurality of data lines arranged on the base substrate and extending in a first direction, and a plurality of gate lines arranged on the base substrate and extending in a second direction. The plurality of data lines cross the plurality of gate lines to define a plurality of sub-pixels, each sub-pixel at least includes a first aperture region and a second aperture region spaced apart from each other in the first direction, the second aperture region is offset in the second direction with respect to the first aperture region, and an offset distance is less than or equal to a width of the first aperture region in the second direction.

In a possible embodiment of the present disclosure, a minimum distance between two adjacent first aperture regions in the second direction is equal to the offset distance.

In a possible embodiment of the present disclosure, in a same sub-pixel, the first aperture region and the second aperture region share a same switch element, share a same data line as a signal input line, and share a same gate line as a switch control line of the switch element.

In a possible embodiment of the present disclosure, the gate line shared by the first aperture region and the second aperture region in the same sub-pixel is arranged between the first aperture region and the second aperture region; or the gate line shared by the first aperture region and the second aperture region in the same sub-pixel is arranged at a side of the first aperture region away from the second aperture region; or the gate line shared by the first aperture region and the second aperture region in the same sub-pixel is arranged at a side of the second aperture region away from the first aperture region.

In a possible embodiment of the present disclosure, the data line is arranged in a non-aperture region of the sub-pixel in the form of a folded line.

In a possible embodiment of the present disclosure, the sub-pixel includes a first side and a second side arranged opposite to each other, the data line is arranged at the first side and the second side, the data line includes a plurality of first repeating units coupled to each other in sequence in the first direction, and each first repeating unit includes: a first vertical line segment arranged at a first side of the first aperture region and extending in the first direction, the first vertical line segment including a first end away from the second aperture region and a second end close to the second aperture region; a second vertical line segment arranged at a second side of the second aperture region and extending in the first direction, the second vertical line segment including a third end close to the first aperture region and a fourth end away from the first aperture region; a first oblique line segment coupled between the second end of the first vertical line segment and the third end of the second vertical line segment, the first oblique line segment being angled relative to the first vertical line segment by a first angle; and a second oblique line segment coupled to the first end of the first vertical line segment or the fourth end of the second vertical line segment, the second oblique line segment being angled relative to the first vertical line segment by a second angle.

In a possible embodiment of the present disclosure, the first vertical line segment, the second vertical line segment, the first oblique line segment and the second oblique line segment are formed integrally and arranged at a same layer and made of a same material; or at least two of the first vertical line segment, the second vertical line segment, the first oblique line segment and the second oblique line segment are arranged at different layers and coupled to each other through a via hole.

In a possible embodiment of the present disclosure, the sub-pixel includes a first side and a second side arranged opposite to each other, the data line is arranged at the first side and the second side, the data line includes a plurality of second repeating units coupled to each other in sequence in the first direction, and each second repeating unit includes: a third vertical line segment arranged at a first side or a second side of the first aperture region, the third vertical line segment including a first end close to the second aperture region and a second end away from the second aperture region; and a transparent conductive line, an orthogonal projection of the transparent conductive line onto the base substrate at least partially overlapping an orthogonal projection of the second aperture region onto the base substrate, the transparent conductive line being coupled to the first end of the third vertical line segment, and a length of the transparent conductive line in the first direction being greater than or equal to a length of the second aperture region in the first direction.

In a possible embodiment of the present disclosure, the transparent conductive line is arranged at a same layer and not made of a same material as the third vertical line segment; or the transparent conductive line is arranged at a different layer and insulated from the third vertical line segment, and transparent conductive line is coupled to the third vertical line segment through a via hole.

In a possible embodiment of the present disclosure, the third vertical line segment is a source/drain metal line, and the transparent conductive line is an indium tin oxide conductive line.

In a possible embodiment of the present disclosure, the display substrate further includes a common electrode layer arranged on the base substrate. The common electrode layer is a light shielding conductive layer or a light transmitting conductive layer, the common electrode layer is provided with an aperture region, and the aperture region is configured to define the first aperture region and the second aperture region.

In a possible embodiment of the present disclosure, the display substrate further includes a plurality of pixel electrodes, and each sub-pixel is provided with a pixel electrode.

In a possible embodiment of the present disclosure, the pixel electrode is a transparent conductive electrode, and the pixel electrode includes: a first electrode block portion arranged in the first aperture region; a second electrode block portion arranged in the second aperture region; and a connection bridge portion coupled between the first electrode block portion and the second electrode block portion.

In a possible embodiment of the present disclosure, a shape of the first electrode block portion matches a shape of a space surrounded by the data lines arranged at the first side and the second side of the first aperture region corresponding to the first electrode block portion.

In a possible embodiment of the present disclosure, the switch element is arranged at a position where the gate line crosses the data line.

The present disclosure has the following beneficial effects.

According to the display substrate and the display device in the embodiments of the present disclosure, each sub-pixel on the display substrate is at least divided into an upper pixel aperture and a lower pixel aperture, i.e., the first aperture region and the second aperture region, spaced apart from each other in the first direction (i.e., an extension direction of the data line), the second aperture region is offset in the second direction (i.e., an extension direction of the gate line) with respect to the first aperture region, and an offset distance is less than or equal to the width of the first aperture region in the second direction. In other words, in the extension direction of the data line, the first aperture region partially overlaps the second aperture region, or the second aperture region is offset with respect to the first aperture region by the width of the first aperture region. As a result, it is able for the first aperture region to be complementary to the second aperture region of each pixel, thereby to enable the pixel to emit light continuously, and prevent the occurrence of moire pattern in the 3D display.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It is necessary to describe the related art as follows before the detailed description on the present disclosure.

Figure 1:
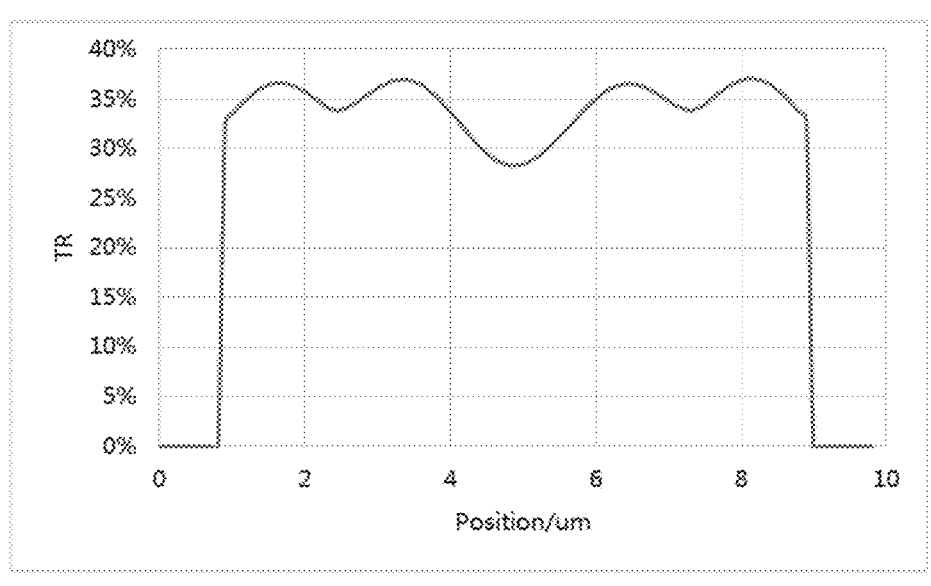
FIG. 1 is a curve diagram showing transmittances of a single pixel at different positions in a conventional pixel structure in a display substrate in the related art.

In the related art, a 3D display product based on ultra-high resolution has such problems as moire pattern, and one of the reasons for the moire pattern lies in light-emission discontinuity of pixels. In a conventional pixel design, an SD line, e.g., a data line, is linear and non-transparent, and FIG. 1 shows transmittances of a single pixel at different positions. In FIG. 1, the abscissa represents a position in the single pixel in an extension direction of a gate line, and the ordinate represents the transmittance of the pixel at a same position point. When an image is displayed, periodic light shielding regions will appear between the pixels (i.e., the transmittance at a position where the data line is arranged is 0), so the pixels emit light discontinuously. In a 3D display state, the moire pattern occurs due to the light-emission discontinuity of pixels.

An object of the present disclosure is to provide a display substrate and a display device, so as to improve light-emission continuity of pixels, thereby to prevent the occurrence of the moire pattern.

Figure 2:
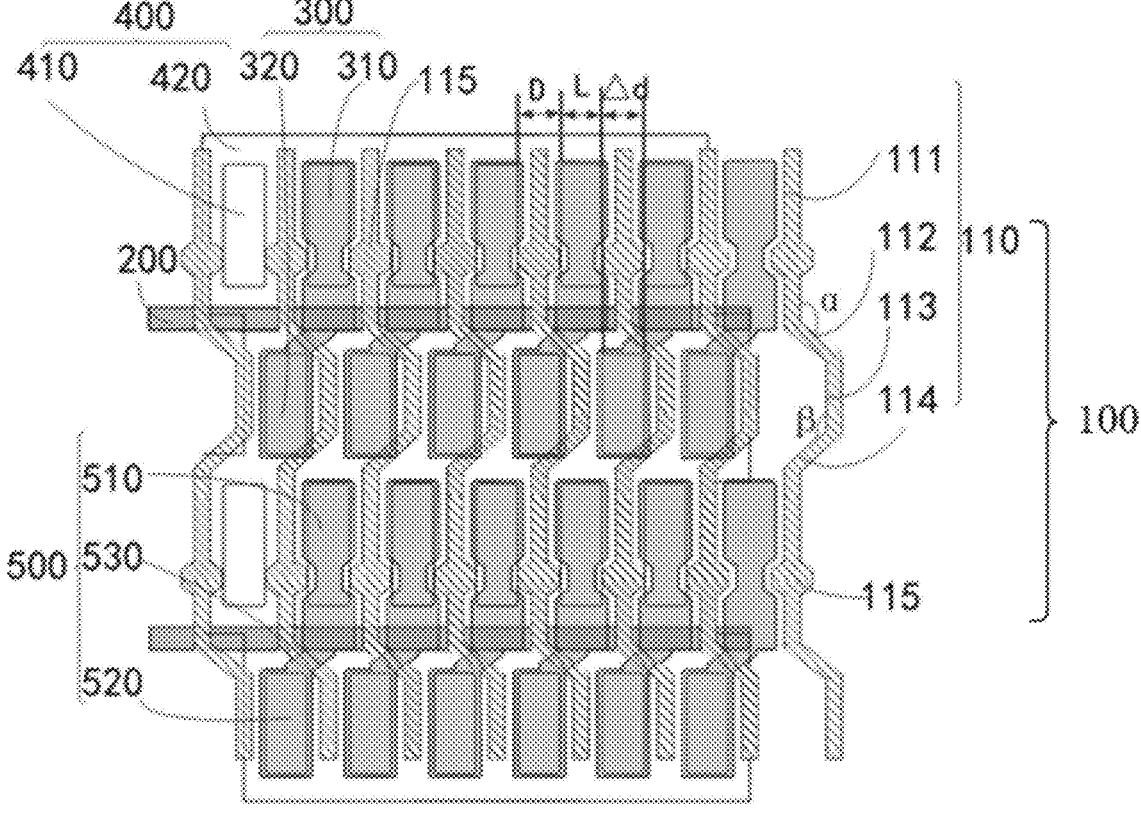
FIG. 2 is a schematic view showing a display substrate according to one embodiment of the present disclosure.
Figure 3:
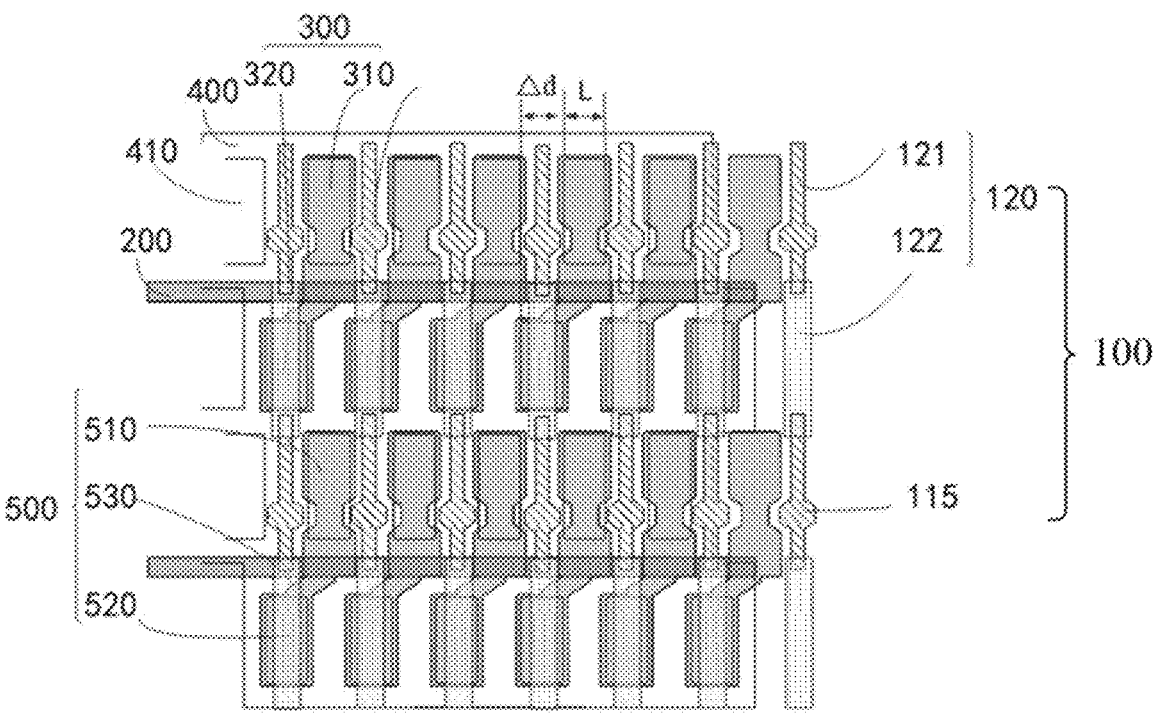
FIG. 3 is another schematic view showing the display substrate according to one embodiment of the present disclosure.

FIG. 2 and FIG. 3 are front views of a display substrate in the embodiments of the present disclosure, in which merely a partial pixel array on the display substrate is shown.

As shown in FIG. 2 and FIG. 3, the display substrate includes a base substrate, and a plurality of data lines 100 and a plurality of gate lines 200 arranged on the base substrate. Each data line 100 extends in a first direction, each gate line 200 extends in a second direction, and the plurality of data lines 100 and the plurality of gate lines 200 cross each other. The display substrate includes a plurality of pixel units arranged in an array form, each pixel unit includes at least two sub-pixels 300, each sub-pixel 300 at least includes a first aperture region 310 and a second aperture region 320 spaced apart from each other in the first direction, the second aperture region 320 is offset in the second direction with respect to the first aperture region 310, and an offset distance Δd is less than or equal to a width L of the first aperture region 310 in the second direction.

Based on the above, each sub-pixel 300 on the display substrate is at least divided into an upper pixel aperture and a lower pixel aperture, i.e., the first aperture region 310 and the second aperture region 320, spaced apart from each other in the first direction (i.e., an extension direction of the data line 100), and the second aperture region 320 is offset in the second direction (i.e., an extension direction of the gate line 200) with respect to the first aperture region 310, and an offset distance Δd is less than or equal to the width L of the first aperture region 310 in the second direction. In other words, in the extension direction of the data line 100, the first aperture region 310 partially overlaps the second aperture region 320, or the second aperture region 320 is offset with respect to the first aperture region 310 by the width of one first aperture region 310, and the first aperture region 310 and the second aperture region 320 are arranged in a staggered manner. As a result, it is able for the first aperture region 310 to be complementary to the second aperture region 320 of each sub-pixel 300, thereby to enable the sub-pixel 300 to emit light continuously, and prevent the occurrence of moire pattern in the 3D display.

It should be appreciated that, in the above schemes, the first aperture region and the second aperture region of the sub-pixel refer to aperture regions in a light shielding film layer for limiting an aperture size of the sub-pixel on the display substrate. For example, an aperture pattern is designed in a pixel definition layer separately arranged on the display substrate to form the first aperture region and the second aperture region, or an aperture pattern is designed in a light shielding conductive layer (e.g., a common electrode layer made of a light shielding metal) on the display substrate to define the first aperture region and the second aperture region.

In some embodiments of the present disclosure, as shown in FIG. 2 and FIG. 3, the offset distance Δd of the first aperture region 310 with respect to the second aperture region 320 is less than the width L of the first aperture region 310, so the first aperture region 310 partially overlaps the second aperture region 320 in the second direction.

In some other embodiments of the present disclosure, as shown in FIG. 2 and FIG. 3, the offset distance Δd of the first aperture region 310 with respect to the second aperture region 320 is equal to the width of the first aperture region 310 in the second direction. In this regard, taking the direction in FIG. 2 or FIG. 3 as an example, in a same sub-pixel 300, a left edge of the first aperture region 310 is aligned with a right edge of the second aperture region 320.

In addition, in some embodiments of the present disclosure, as shown in FIG. 2 and FIG. 3, a minimum distance D between two adjacent first aperture regions 310 in the second direction is equal to the offset distance Δd. Still taking the direction in FIG. 2 as an example, a right edge of the first aperture region 310 in the sub-pixel 300 is aligned with a left edge of the second aperture region 320 in an adjacent sub-pixel 300 on the right, so as to prevent the occurrence of crosstalk between the adjacent sub-pixels 300.

In addition, in some embodiments of the present disclosure, the plurality of gate lines 200 and the plurality of data lines 100 in the display substrate cross each other to define a plurality of sub-pixels 300, and each sub-pixel 300 is provided with a switch element and a pixel electrode 500. The switch element is a thin film transistor (not shown) including a source electrode, a drain electrode and a gate electrode, the gate line 200 is coupled to the gate electrode, the data line 100 is coupled to the source electrode, the drain electrode is coupled to the pixel electrode 500, the gate line 200 serves as a switch control line of the switch element, and the data line 100 serves as a signal input line.

For example, the switch element is arranged at a position where the gate line 200 crosses the data line 100.

In the embodiments of the present disclosure, in a same sub-pixel 300, the first aperture region 310 and the second aperture region 320 share a same switch element, share a same data line 100 as the signal input line, and share a same gate line 200 as the switch control line of the switch element. In this regard, it is able to ensure that a light emitting state of the first aperture region 310 is the same as a light emitting state of the second aperture region 320 in the same sub-pixel 300, thereby to ensure the light-emission continuity of the sub-pixel 300.

It should be appreciated that, in the display substrate in the related art, the plurality of gate lines 200 and the plurality of data lines 100 cross each other to define a plurality of sub-pixels 300, and each sub-pixel 300 is arranged at a side of the gate line 200 for controlling the sub-pixel 300. However, for the display substrate in the embodiments of the present disclosure, each sub-pixel 300 is divided into the first aperture region 310 and the second aperture region 320, and the first aperture region 310 and the second aperture region 320 in a same sub-pixel 300 need to share one gate line 200. As shown in FIG. 2 and FIG. 3, the gate line 300 shared by the first aperture region 310 and the second aperture region 320 in the same sub-pixel 300 is arranged between the first aperture region 310 and the second aperture region 320. The gate line 200 needs to be coupled to the switch element, so when the gate line 200 is arranged between the first aperture region 310 and the second aperture region 320, it is able to facilitate the connection among the gate line 200, the switch element, the pixel electrode 500 and the data line 100 in terms of spatial layout.

It should be appreciated that, in some other embodiments of the present disclosure, the gate line 200 shared by the first aperture region 310 and the second aperture region 320 in the same sub-pixel 300 is arranged at a side of the first aperture region 310 away from the second aperture region 320.

In some other embodiments of the present disclosure, the gate line 200 shared by the first aperture region 310 and the second aperture region 320 in the same sub-pixel 300 is arranged at a side of the second aperture region 320 away from the first aperture region 310.

In addition, in the display substrate in the embodiments of the present disclosure, the sub-pixel 300 includes a first side and a second side arranged opposite to each other, and the data line 100 is arranged at the first side and the second side. As shown in FIG. 2 and FIG. 3, the first side is a left side of the sub-pixel 300, and the second side is a right side of the sub-sub-pixel 300. For ease of understanding, the first side and the second side are the left side and the right side respectively in the following description.

In the display substrate in the embodiments of the present disclosure, as shown in FIG. 2, the first aperture region 310 and the second aperture region 320 in the sub-pixel 300 are offset and misaligned in the second direction, light shielding regions at the first side and the second side of the sub-pixel 300 are of a non-linear shape, the first aperture region 310 and the second aperture region 320 share a same data line 100, and the data line 100 should be arranged in the light shielding region of the sub-pixel 300. In this regard, in the embodiments of the present disclosure, the data line 100 is a folded line rather than a straight line, i.e., the data line 100 is arranged in a non-aperture region of the sub-pixel 300 in the form of a folded line.

For example, as shown in FIG. 2, the data line 100 includes a plurality of first repeating units 110 coupled to each other in sequence in the first direction, and each first repeating unit 110 includes a first vertical line segment 111, a second vertical line segment 113, a first oblique line segment 112, and a second oblique line segment 114. The first vertical line segment 111 is arranged at a first side of the first aperture region 310 and extending in the first direction, and the first vertical line segment 111 includes a first end away from the second aperture region 320 and a second end close to the second aperture region 320. The second vertical line segment 113 is arranged at a second side of the second aperture region 320 and extending in the first direction, and the second vertical line segment 113 includes a third end close to the first aperture region 310 and a fourth end away from the first aperture region 310. The first oblique line segment 112 is coupled between the second end of the first vertical line segment 111 and the third end of the second vertical line segment 113, and the first oblique line segment 112 is angled relative to the first vertical line segment 111 by a first angle α. The second oblique line segment 114 is coupled to the first end of the first vertical line segment 111 or the fourth end of the second vertical line segment 113, and the second oblique line segment 114 is angled relative to the first vertical line segment 111 by a second angle β.

For example, the first repeating unit 110 is approximately of an S-like shape or an inverted-S shape.

It should be appreciated that, as shown in FIG. 2, the first angle α is an angle between the first oblique line segment 112 and the first vertical line segment 111, e.g., the first angle α is an obtuse angle, and the second angle β is an angle between the second oblique line segment 114 and the second vertical line segment 113, e.g., the second angle β is an obtuse angle.

Values of the first angle α and the second angle β are not particularly defined herein.

For example, the first angle α is greater than 90° and less than 150°, and the second angle β is greater than 90° and less than 150°. In this regard, it is able to prevent a decrease in an aperture ratio of the sub-pixel 300 due to the folded data line 100.

In addition, in some embodiments of the present disclosure, the first vertical line segment 111, the second vertical line segment 113, the first oblique line segment 112 and the second oblique line segment 114 are formed integrally and arranged at a same layer and made of a same material. For example, the first vertical line segment 111, the second vertical line segment 113, the first oblique line segment 112 and the second oblique line segment 114 in the first repeating unit 110 are all patterns formed through patterning a source/drain metal layer.

In some other embodiments of the present disclosure, at least two of the first vertical line segment 111, the second vertical line segment 113, the first oblique line segment 112 and the second oblique line segment 114 are arranged at different layers and insulated from each other, and coupled to each other through a via hole.

In addition, in the embodiments of the present disclosure, the data line 100 is coupled to the drain electrode of the switch element, so the data line 100 is provided with a connection portion 115 coupled to the switch element. For example, as shown in FIG. 2, when the gate line 200 is arranged in the light shielding region between the first aperture region 310 and the second aperture region 320, the connection portion 115 is arranged on the first vertical line segment 111. Of course, it should be appreciated that, a specific position of the connection portion 115 may be selected in accordance with a specific position of the gate line 200.

In the embodiments of the present disclosure, the sub-pixel 300 is divided into the first aperture region 310 and the second aperture region 320, so the data line 100 is designed in the form of a folded line to match a wiring space in the light shielding region. In the other embodiments the present disclosure, the data line 100 may have any other structures.

For example, as shown in FIG. 3, in some embodiments of the present disclosure, the data line 100 includes a plurality of second repeating units 120 coupled to each other in sequence in the first direction, and each second repeating unit 120 includes a third vertical line segment 121 and a transparent conductive line 122. The third vertical line segment 121 is arranged at the first side or the second side of the first aperture region 310, and the third vertical line segment 121 includes a first end close to the second aperture region 320 and a second end away from the second aperture region 320; and an orthogonal projection of the transparent conductive line 122 onto the base substrate at least partially coinciding with an orthogonal projection of the second aperture region 320 onto the base substrate, a length of the transparent conductive line 122 in the first direction is greater than or equal to a length of the second aperture region 320 in the first direction, and the transparent conductive line 122 is coupled to the first end of the third vertical line segment 121.

Here, the data line 100 is not a folded line, and it includes the second repeating units 120 each formed through linearly coupling the transparent conductive line 122 to the third vertical line segment 121. A central line of the third vertical line segment and a central line of the transparent conductive line 122 are arranged on a same straight line. A part of the data line 100 passing through the second aperture region 320 is the transparent conductive line 122, so it is able to prevent the light transmittance of the second aperture region 320 from being adversely affected.

It should be appreciated that, as shown in FIG. 3, a length of the transparent conductive line 122 in the first direction is greater than or equal to a length of the second aperture region 320 in the first direction, i.e., the transparent conductive line covers the second aperture region in the extension direction of the data line, so as to prevent the light transmittance of the second aperture region from being adversely affected by the data line.

In addition, as shown in FIG. 3, a relationship between the length of the transparent conductive line and the width of the second aperture region in the second direction is not particularly defined, i.e., the transparent conductive line may or may not cover the second aperture region in the extension direction of the gate line.

In the embodiments of the present disclosure, the transparent conductive line 122 is arranged at a same layer and not made of a same material as the third vertical line segment 121. In other words, the transparent conductive line 122 is arranged at a same layer as the third vertical line segment 121, and during the manufacture of the display substrate, patterns of the third vertical line segment 121 and the transparent conductive line 122 are formed respectively through two mask processes (i.e. two patterning processes).

In addition, the transparent conductive 122 line may be arranged at a different layer and insulated from the third vertical line segment 121, and the transparent conductive line 122 is coupled to the third vertical line segment 121 through a via hole. During the manufacture of the display substrate, patterns of the third vertical line segment 121 and the transparent conductive line 122 are formed respectively through two mask processes (i.e. two patterning processes).

In the embodiments of the present disclosure, the third vertical line segment 121 is a source/drain metal line, and the transparent conductive line is an indium tin oxide conductive line. Of course, it should be appreciated that, materials of the third vertical line segment 121 and the transparent conductive line 122 are not limited thereto.

In addition, in the embodiments of the present disclosure, the data line 100 is coupled to the drain electrode of the switch element, so the data line 100 is provided with a connection portion coupled to the switch element. For example, as shown in FIG. 3, when the gate line 200 is arranged in the light shielding region between the first aperture region 310 and the second aperture region 320, the connection portion is arranged on the third vertical line segment 121. Of course, it should be appreciated that, a specific position of the connection portion may be selected in accordance with a specific position of the gate line 200.

In addition, in some embodiments of the present disclosure, as shown in FIG. 2 and FIG. 3, the display substrate further includes a common electrode layer 400 arranged on the base substrate, the common electrode layer 400 is a light shielding conductive layer and provided with an aperture region 410, and the aperture region 410 defines the first aperture region 310 and the second aperture region 320.

Based on the above, the common electrode layer 400 is a light shielding conductive layer, and the first aperture region 310 and the second aperture region 320 are defined through forming a pattern of an aperture region 410 on the common electrode layer 400. In this way, a non-aperture region 420 of the common electrode factions as to shield light, so it is able to ensure the transmittance consistency at different position points in each sub-pixel 300.

In some other embodiments of the present disclosure, the common electrode layer 400 is a light transmitting conductive layer and provided with an aperture region 410, and the aperture region 410 defines the first aperture region 310 and the second aperture region 320. Compared with the scheme where the common electrode layer 400 is the light shielding conductive layer, when the common electrode layer 400 is the light transmitting conductive layer, such a problem as transmittance inconsistency at different positions in the light shielding region of the sub-pixel 300 may still exist. In this regard, in actual use, the light shielding conductive layer is selected as the common electrode layer 400 so as to improve the transmittance consistency.

In addition, in some embodiments of the present disclosure, as shown in FIG. 2 and FIG. 3, the display substrate further includes a plurality of pixel electrodes 500, each sub-pixel 300 is provided with a pixel electrode 500, and the pixel electrode 500 is coupled to the source electrode of the switch element.

For example, the pixel electrode 500 is a transparent conductive electrode. It includes a first electrode block portion 510 arranged in the first aperture region 310, a second electrode block portion 520 arranged in the second aperture region 320, and a connection bridge portion 530 coupled between the first electrode block portion 510 and the second electrode block portion 520.

In addition, in some embodiments of the present disclosure, when the first vertical line segment 111 is provided with the connection portion, a shape of the first electrode block portion 510 matches a shape of a space surrounded by data lines 100 arranged at the first side and the second side of the first aperture region 310 corresponding to the first electrode block portion 510.

Figure 4:
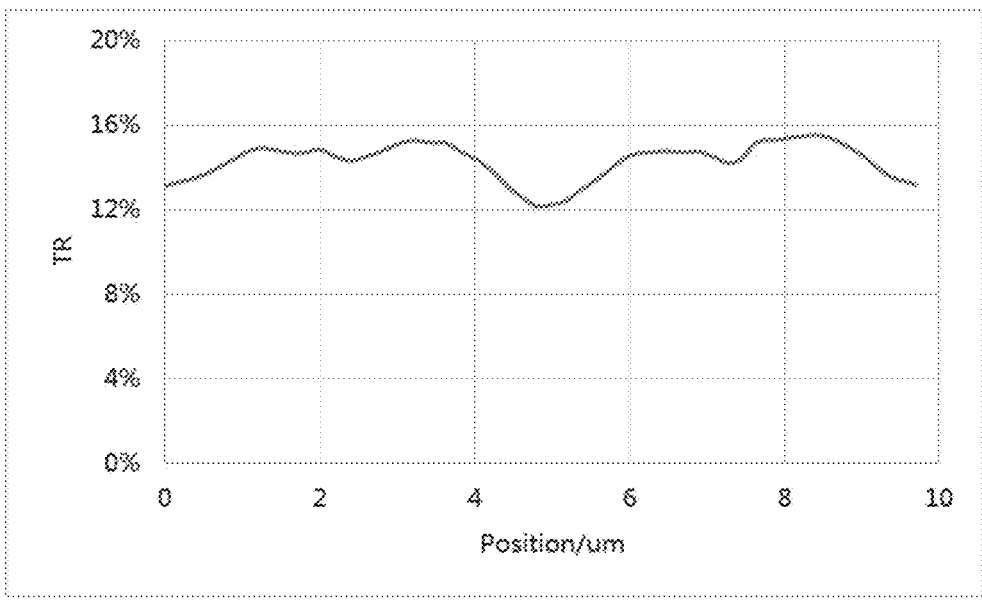
FIG. 4 is a curve diagram showing transmittances of a single pixel at different positions in the display substrate in FIG. 2 where a common electrode layer is a light shielding conductive layer.

FIG. 4 is a curve diagram showing the transmittance of a pixel structure in the display substrate (e.g., the display substrate in FIG. 2) in the embodiments of the present disclosure, the common electrode layer in the display substrate is a light shielding electrode layer, and the data line is a folded line. In FIG. 4, the abscissa represents a position in a single sub-pixel 300 in the extension direction of a gate line 200, and the ordinate represents an average value of the transmittance of the first aperture region 310 and the transmittance of the second aperture region 320 at the same position. As shown in FIG. 4, the pixel structure in the display substrate does not have any position with a transmittance of 0, so the sub-pixel 300 emits light continuously. In a moire pattern test, a test result shows that the moire pattern is effectively eliminated.

Figure 5:
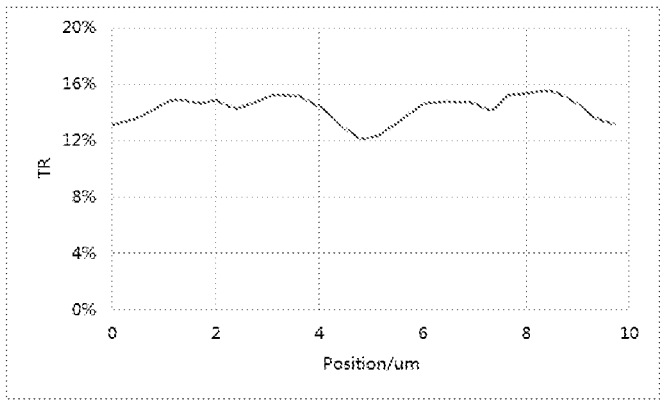
FIG. 5 is a curve diagram showing the transmittances of the single pixel at different positions in the display substrate in FIG. 3.

FIG. 5 is another curve diagram showing the transmittance of the pixel structure in the display substrate (e.g., the display substrate in FIG. 3) in the embodiments of the present disclosure, the common electrode layer in the display substrate is a light shielding electrode layer, and the data line in the display substrate includes the third vertical line segment and the transparent conductive line (e.g., the display substrate in FIG. 3). In FIG. 5, the abscissa represents a position in a single sub-pixel 300 in the extension direction of the gate line 200, and the ordinate represents an average value of the transmittance of the first aperture region 310 and the transmittance of the second aperture region 320 at the same position. As shown in FIG. 5, the pixel structure in the display substrate does not have any position with a transmittance of 0, so the sub-pixel 300 emits light continuously. In a moire pattern test, a test result shows that the moire pattern is effectively eliminated.

Figure 6:
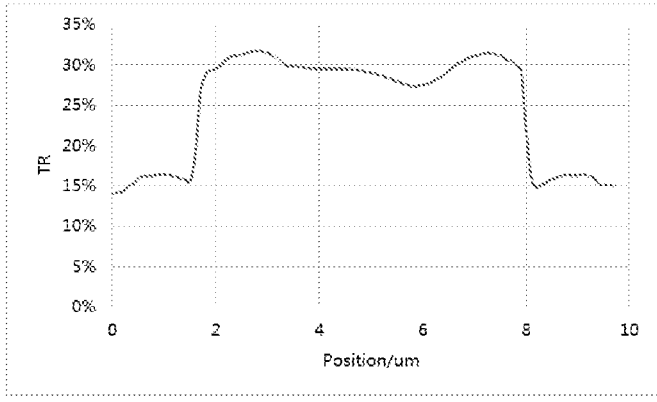
FIG. 6 is a curve diagram showing the transmittances of the single pixel at different positions in the display substrate in FIG. 2 where the common electrode layer is a light transmitting conductive layer.

FIG. 6 is a curve diagram showing the transmittance of the pixel structure in the display substrate (e.g., the display substrate in FIG. 2) in the embodiments of the present disclosure, the common electrode layer in the display substrate is a light transmitting electrode layer, and the data line in the display substrate is a folded line. A difference between the display substrate in FIG. 2 and the display substrate in FIG. 4 lies in that the common electrode layer is the light transmitting electrode layer. In FIG. 6, the abscissa represents a position in a single sub-pixel 300 in the extension direction of the gate line 200, and the ordinate represents an average value of the transmittance of the first aperture region 310 and the transmittance of the second aperture region 320 at the same position. As shown in FIG. 6, the pixel structure in the display substrate does not have any position with a transmittance of 0, so the sub-pixel 300 emits light continuously. In a moire pattern test, a test result shows that the moire pattern is effectively eliminated.

Some description will be given as follows.

(1) The drawings merely relate to structures involved in the embodiments of the present disclosure, and the other structures may refer to those known in the art.

(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.

(3) In the case of no conflict, the embodiments of the present disclosure and the features therein may be combined to acquire new embodiments.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A display substrate, comprising a base substrate, a plurality of data lines arranged on the base substrate and extending in a first direction, and a plurality of gate lines arranged on the base substrate and extending in a second direction, wherein the plurality of data lines cross the plurality of gate lines to define a plurality of sub-pixels, each sub-pixel at least comprises a first aperture region and a second aperture region spaced apart from each other in the first direction, the second aperture region is offset in the second direction with respect to the first aperture region, and an offset distance is less than or equal to a width of the first aperture region in the second direction;

wherein a minimum distance between adjacent sides of adjacent first aperture regions in the second direction is equal to the offset distance.

2. The display substrate according to claim 1, wherein in a same sub-pixel, the first aperture region and the second aperture region share a same switch element, share a same data line as a signal input line, and share a same gate line as a switch control line of the switch element.

3. The display substrate according to claim 2, wherein the gate line shared by the first aperture region and the second aperture region in the same sub-pixel is arranged between the first aperture region and the second aperture region; or the gate line shared by the first aperture region and the second aperture region in the same sub-pixel is arranged at a side of the first aperture region away from the second aperture region; or the gate line shared by the first aperture region and the second aperture region in the same sub-pixel is arranged at a side of the second aperture region away from the first aperture region.

4. The display substrate according to claim 1, wherein the data line is arranged in a non-aperture region of the sub-pixel in the form of a folded line.

5. The display substrate according to claim 4, wherein the sub-pixel comprises a first side and a second side arranged opposite to each other, the data line is arranged at the first side and the second side, the data line comprises a plurality of first repeating units coupled to each other in sequence in the first direction, and each first repeating unit comprises: a first vertical line segment arranged at a first side of the first aperture region and extending in the first direction, the first vertical line segment comprising a first end away from the second aperture region and a second end close to the second aperture region; a second vertical line segment arranged at a second side of the second aperture region and extending in the first direction, the second vertical line segment comprising a third end close to the first aperture region and a fourth end away from the first aperture region; a first oblique line segment coupled between the second end of the first vertical line segment and the third end of the second vertical line segment, the first oblique line segment being angled relative to the first vertical line segment by a first angle; and a second oblique line segment coupled to the first end of the first vertical line segment or the fourth end of the second vertical line segment, the second oblique line segment being angled relative to the first vertical line segment by a second angle.

6. The display substrate according to claim 5, wherein the first vertical line segment, the second vertical line segment, the first oblique line segment and the second oblique line segment are formed integrally and arranged at a same layer and made of a same material; or at least two of the first vertical line segment, the second vertical line segment, the first oblique line segment and the second oblique line segment are arranged at different layers and coupled to each other through a via hole.

7. The display substrate according to claim 1, wherein the sub-pixel comprises a first side and a second side arranged opposite to each other, the data line is arranged at the first side and the second side, the data line comprises a plurality of second repeating units coupled to each other in sequence in the first direction, and each second repeating unit comprises: a third vertical line segment arranged at a first side or a second side of the first aperture region, the third vertical line segment comprising a first end close to the second aperture region and a second end away from the second aperture region; and a transparent conductive line, an orthogonal projection of the transparent conductive line onto the base substrate at least partially overlapping an orthogonal projection of the second aperture region onto the base substrate, the transparent conductive line being coupled to the first end of the third vertical line segment, and a length of the transparent conductive line in the first direction being greater than or equal to a length of the second aperture region in the first direction.

8. The display substrate according to claim 7, wherein the transparent conductive line is arranged at a same layer and not made of a same material as the third vertical line segment; or the transparent conductive line is arranged at a different layer and insulated from the third vertical line segment, and transparent conductive line is coupled to the third vertical line segment through a via hole.

9. The display substrate according to claim 8, wherein the third vertical line segment is a source/drain metal line, and the transparent conductive line is an indium tin oxide conductive line.

10. The display substrate according to claim 1, further comprising a common electrode layer arranged on the base substrate, wherein the common electrode layer is a light shielding conductive layer or a light transmitting conductive layer, the common electrode layer is provided with an aperture region, and the aperture region is configured to define the first aperture region and the second aperture region.

11. The display substrate according to claim 1, further comprising a plurality of pixel electrodes, and each sub-pixel is provided with a pixel electrode.

12. The display substrate according to claim 11, wherein the pixel electrode is a transparent conductive electrode, and the pixel electrode comprises: a first electrode block portion arranged in the first aperture region; a second electrode block portion arranged in the second aperture region; and a connection bridge portion coupled between the first electrode block portion and the second electrode block portion.

13. The display substrate according to claim 12, wherein a shape of the first electrode block portion matches a shape of a space surrounded by the data lines arranged at the first side and the second side of the first aperture region corresponding to the first electrode block portion.

14. The display substrate according to claim 2, wherein the switch element is arranged at a position where the gate line crosses the data line.

15. A display device comprising the display substrate according to claim 1.

16. The display device according to claim 15, wherein in a same sub-pixel, the first aperture region and the second aperture region share a same switch element, share a same data line as a signal input line, and share a same gate line as a switch control line of the switch element.

17. The display device according to claim 16, wherein the gate line shared by the first aperture region and the second aperture region in the same sub-pixel is arranged between the first aperture region and the second aperture region; or the gate line shared by the first aperture region and the second aperture region in the same sub-pixel is arranged at a side of the first aperture region away from the second aperture region; or the gate line shared by the first aperture region and the second aperture region in the same sub-pixel is arranged at a side of the second aperture region away from the first aperture region.

18. The display device according to claim 15, wherein the data line is arranged in a non-aperture region of the sub-pixel in the form of a folded line.

\* \* \* \* \*